(12) United States Patent
Yamazaki

(10) Patent No.: US 8,786,035 B2
(45) Date of Patent: Jul. 22, 2014

(54) ELECTRONIC DEVICE HAVING MEMS ELEMENT AND RESISTIVE ELEMENT

(71) Applicant: Kabushiki Kaisha Toshiba, Tokyo (JP)

(72) Inventor: Hiroaki Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/830,639

(22) Filed: Mar. 14, 2013

(65) Prior Publication Data

US 2014/0070335 A1 Mar. 13, 2014

(30) Foreign Application Priority Data

Sep. 10, 2012 (JP) ................................. 2012-198261

(51) Int. Cl.
| | | |
|---|---|---|
| *H01L 29/84* | (2006.01) | |
| *H01L 49/02* | (2006.01) | |
| *B81B 7/00* | (2006.01) | |

(52) U.S. Cl.
CPC ................ *H01L 28/20* (2013.01); *H01L 29/84* (2013.01); *B81B 7/0003* (2013.01)
USPC ........................................................ 257/415

(58) Field of Classification Search
CPC .... H01L 29/84; B81B 3/0086; B81B 7/0003; B81B 7/0032; B81B 7/0048; B81B 7/0648; B81C 1/00269; B81C 1/00134; B81C 1/0023; B81C 1/00238; B81C 1/00277
USPC ................................................. 257/415–416
See application file for complete search history.

(56) References Cited

U.S. PATENT DOCUMENTS

| | | | | |
|---|---|---|---|---|
| 7,427,797 | B2 * | 9/2008 | Ohguro et al. ................ | 257/415 |
| 7,566,956 | B2 * | 7/2009 | Mitarai et al. ................ | 257/678 |
| 2009/0108381 | A1 * | 4/2009 | Buchwalter et al. .......... | 257/415 |
| 2009/0127639 | A1 * | 5/2009 | Suzuki et al. ................. | 257/415 |
| 2010/0285627 | A1 * | 11/2010 | Tateishi et al. ................. | 438/51 |
| 2011/0068374 | A1 * | 3/2011 | Tan et al. ....................... | 257/254 |
| 2012/0001276 | A1 * | 1/2012 | Huang et al. .................. | 257/416 |
| 2012/0043594 | A1 * | 2/2012 | Tateishi et al. ................ | 257/288 |
| 2012/0217625 | A1 * | 8/2012 | Mohan et al. ................. | 257/664 |
| 2012/0235959 | A1 * | 9/2012 | Endisch ........................ | 345/204 |

FOREIGN PATENT DOCUMENTS

| | | |
|---|---|---|
| JP | 2005-342803 A | 12/2005 |
| JP | 2008-105112 A | 5/2008 |
| JP | 2009-105277 A | 5/2009 |

* cited by examiner

*Primary Examiner* — Nathan Ha

(74) *Attorney, Agent, or Firm* — Holtz Holtz Goodman & Chick PC

(57) ABSTRACT

According to one embodiment, an electronic device includes a drive circuit on a semiconductor substrate, an insulating region including a first insulating part provided on the semiconductor substrate and formed of interlayer insulating films, and a second insulating part provided on the first insulating part, and covering the drive circuit, an element for high-frequency, which is provided on the insulating region, is driven by the drive circuit, an interconnect including a first conductive part in the first insulating part, and a second conductive part in the second insulating part, and transmitting a drive signal from the drive circuit to the element for high-frequency, and a resistive element between the second conductive part and the element for high-frequency.

19 Claims, 3 Drawing Sheets

US 8,786,035 B2

ELECTRONIC DEVICE HAVING MEMS ELEMENT AND RESISTIVE ELEMENT

CROSS-REFERENCE TO RELATED APPLICATIONS

This application is based upon and claims the benefit of priority from Japanese Patent Application No. 2012-198261, filed Sep. 10, 2012, the entire contents of which are incorporated herein by reference.

FIELD

Embodiments described herein relate generally to an electronic device.

BACKGROUND

An electronic device in which a micro electro mechanical system (MEMS) element, and drive circuit configured to drive the MEMS element are provided on the same semiconductor substrate is proposed.

When a high-frequency application element is used as the MEMS element, a high-resistance element is generally provided between the MEMS element and drive circuit in order to prevent a high-frequency component from leaking from the MEMS element into the drive circuit.

However, heretofore, it cannot always be said that the high-resistance element has been provided at an appropriate position. Therefore, it has been difficult to obtain an electronic device with excellent characteristics.

DETAILED DESCRIPTION

In general, according to one embodiment, an electronic device includes: a semiconductor substrate; a drive circuit provided on the semiconductor substrate; an insulating region including a first insulating part provided on the semiconductor substrate and formed of a plurality of interlayer insulating films, and a second insulating part provided on the first insulating part, the insulating region being configured to cover the drive circuit; an element for high-frequency, which is provided on the insulating region, is driven by the drive circuit, and to which a high-frequency signal is applied; an interconnect including a first conductive part provided in the first insulating part, and a second conductive part provided in the second insulating part, the interconnect being configured to transmit a drive signal from the drive circuit to the element for high-frequency; and a resistive element provided between the second conductive part and the element for high-frequency.

Hereinafter embodiments will be described with reference to the drawings.

Embodiment 1

Figure 1:
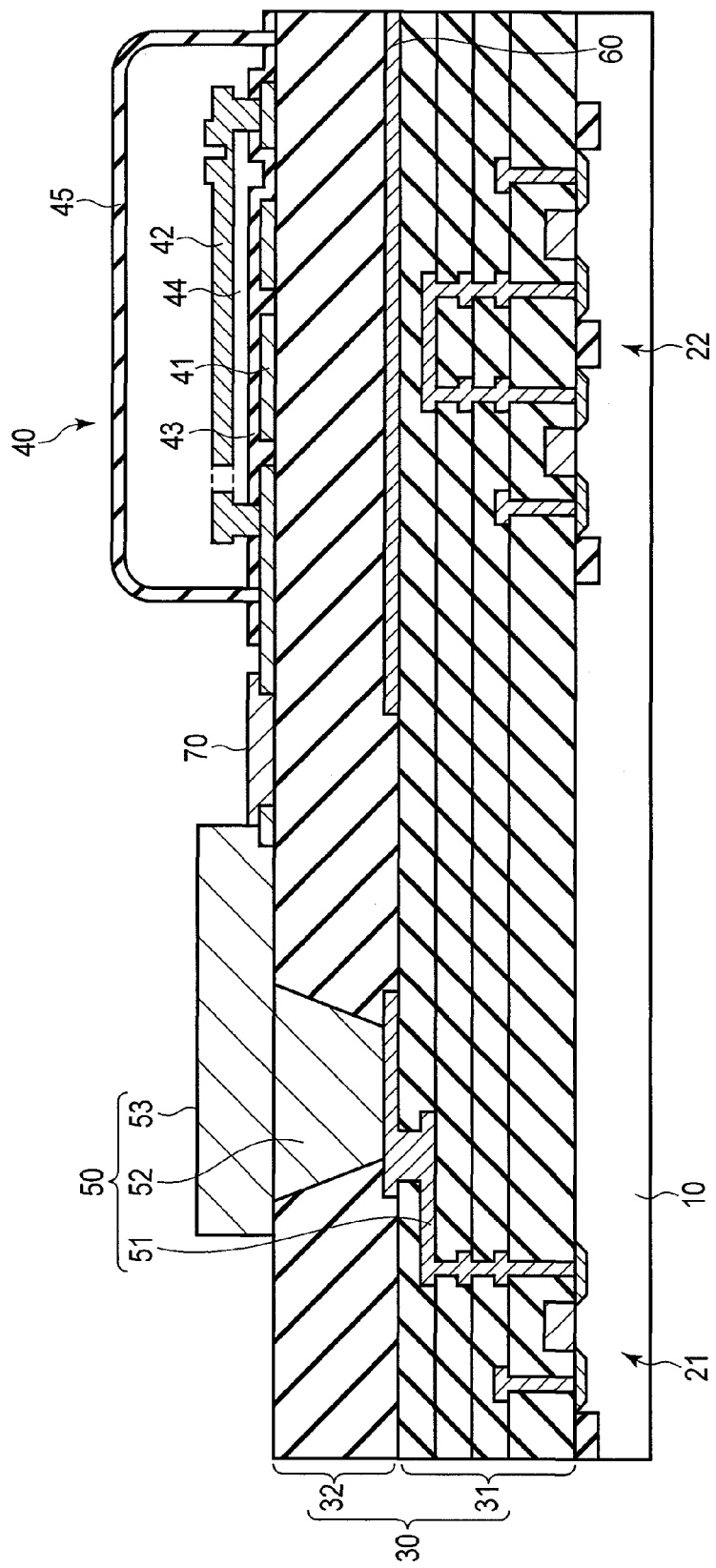
FIG. 1 is a cross-sectional view schematically showing the configuration of an electronic device according to a first embodiment.

FIG. 1 is a cross-sectional view schematically showing the configuration of an electronic device according to a first embodiment.

A drive circuit 21 configured to drive a MEMS element (variable capacitor element) 40 to be described later is provided on a semiconductor substrate (silicon substrate) 10. The drive circuit 21 is constituted of a CMOS circuit, and generates a DC voltage used to change an air gap provided in the MEMS element 40. The DC voltage generated by the drive circuit 21 has a large voltage value, and hence a comparatively large noise is generated from the drive circuit 21. Accordingly, in order to reduce the influence of the noise on the MEMS element 40, the drive circuit 21 is arranged not immediately below the MEMS element 40, but at a position somewhat apart from the MEMS element 40. Further, on the semiconductor substrate 10, a drive circuit 22 is provided. The drive circuit 22 is constituted of a CMOS circuit, and functions as a control circuit or the like for the MEMS element 40.

On the semiconductor substrate 10, an insulating region 30 covering the drive circuit 21 and drive circuit 22 is provided. The insulating region 30 includes a lower insulating part (first insulating part) 31 provided on the semiconductor substrate 10, and formed of a plurality of interlayer insulating films, and upper insulating part (second insulating part) 32 provided on the lower insulating part 31. The upper insulating part 32 is formed of a thick insulating film in order to reduce the parasitic capacitance. More specifically, the upper insulating part 32 includes an insulating film thicker than each of the plurality of interlayer insulating films of the lower insulating part 31. It is desirable that a film having a low dielectric constant or a film having a low dielectric loss tangent be used for the upper insulating part 32 in order to suppress the parasitic capacitance or the dielectric loss of a high-frequency signal. More specifically, a silicon dioxide film or a resin film can be used. The silicon dioxide film can be formed by CVD. The resin film can be formed by spin coating, sticking or the like.

On the insulating region 30, the MEMS element 40 to be driven by the drive circuit 21 is provided. The MEMS element 40 is used as a high-frequency application variable capacitor element, and a high-frequency signal is applied thereto from outside. More specifically, the MEMS element (variable capacitor element) 40 is provided with a lower electrode 41, upper electrode 42, and dielectric layer 43 provided between the lower electrode 41 and upper electrode 42. Further, an air gap 44 is provided between the upper electrode 42, and dielectric layer 43, and the capacitance of the MEMS element 40 can be changed by changing the thickness of the air gap 44 by means of the drive circuit 21. The MEMS element main body constituted of the lower electrode 41, upper electrode 42, dielectric layer 43, and air gap 44 is covered with a protective film 45 formed of a dome-like film.

An interconnect 50 configured to transmit a drive signal from the drive circuit 21 to the MEMS element 40 is provided between the MEMS element 40 and drive circuit 21. The interconnect 50 includes a conductive part (first conductive part) 51 provided in the lower insulating part 31, conductive part (second conductive part) 52 provided in the upper insulating part 32, and conductive part (third conductive part) 53 provided on the upper insulating part 32, and configured to connect the conductive part 52 and MEMS element 40 to each other.

At a position inside the insulating region 30, and below the MEMS element 40, a shield 60 formed of a metallic film is provided. More specifically, the shield 60 is provided on the lower insulating part 31. The shield 60 is connected to the high-frequency ground (RF ground). By providing the shield 60 between the MEMS element 40 and semiconductor substrate 10, it is possible to reduce an influence of the loss component attributable to the parasitic resistance and parasitic capacitance of the semiconductor substrate 10.

A resistive element (high-resistance element) 70 with a high resistance value is provided on the upper insulating part 32. The resistive element 70 is provided between the second conductive part 52 and MEMS element 40. That is, the resistive element 70 is provided in the middle of the conductive part 53. The resistive element 70 is a thin-film resistive element, and is formed of a silicon film such as a polysilicon film, amorphous silicon film, and the like. By providing the resistive element 70, it is possible to prevent the high-frequency component from leaking from the MEMS element 40 into the drive circuit 21.

If the resistive element 70 is not provided, the high-frequency component (RF component) of the high-frequency signal to be applied to the MEMS element 40 from outside leaks into the drive circuit 21 to thereby lower the electric Q value. By providing the resistive element 70, it is possible to prevent such a problem from occurring. Hereinafter, the resistive element 70 will be described.

By providing a resistive element between the MEMS element 40 and drive circuit 21, it is possible to prevent the high-frequency component from leaking from the MEMS element 40 to the drive circuit 21. However, as will be described below, when the position of the resistive element 70 is not appropriate, there is the possibility of excellent circuit characteristics being not obtained.

As already described previously, the upper insulating part 32 is formed of a thick insulating film (for example, a thickness of about 10 to 20 μm) in order to reduce the parasitic capacitance. A via hole for the conductive part 52 is formed in such a thick insulating film, and hence the size (area of the pattern of the via hole) of the via hole inevitably becomes large. For that reason, the influence of the parasitic component (parasitic capacitance or the like) between the conductive part 52 and semiconductor substrate 10 becomes great.

If the resistive element 70 is provided between the conductive part 52 and drive circuit 21, the conductive part 52 and MEMS element 40 are directly connected to each other through only the conductive part 53, and the influence of the parasitic component attributable to the conductive part 52 is directly reflected in the MEMS element 40. As a result, an adverse influence such as lowering of the electric Q value or the like is exerted on the circuit characteristics.

In this embodiment, the resistive element 70 is interposed between the conductive part 52 and MEMS element 40, and hence the influence of the parasitic component attributable to the conductive part 52 on the MEMS element 40 is significantly suppressed by the resistive element 70. That is, the resistive element 70 of a high resistance value is provided at a position closer to the MEMS element 40 than the conductive part 52, and hence it is possible to significantly suppress the influence of the parasitic component attributable to the conductive part 52. As a result, it becomes possible to prevent deterioration of the circuit characteristics such as lowering of the electric Q value or the like from occurring.

Further, the resistive element 70 is provided on the upper insulating part 32 with a large film thickness. Accordingly, it is possible to further reduce the parasitic capacitance between the resistive element 70 and substrate 10 as compared with the case where the resistive element is provided on the lower side of the upper insulating part 32. Therefore, from such a viewpoint too, it is possible to prevent the circuit characteristics from being deteriorated.

As described above, in this embodiment, it is possible to prevent the high-frequency component from leaking from the MEMS element 40 into the drive circuit 21 by means of the resistive element 70, and the resistive element 70 is provided between the conductive part 52 and MEMS element 40, and hence it is possible to prevent the parasitic component attributable to the conductive part 52 from adversely affecting the MEMS element 40. Further, the resistive element 70 is provided on the upper insulating part 32, and hence it is possible to reduce the parasitic capacitance between the resistive element 70 and substrate 10. Further, the upper insulating part 32 includes an insulating film thicker than each of the plurality of interlayer insulating films of the lower insulating part 31, and hence even when the conductive part 52 with a large pattern area is provided, it is possible to reduce the parasitic capacitance between the resistive element 70 and substrate 10 by providing the resistive element 70 on the upper insulating part 32. Accordingly, it is possible to improve the characteristics of the electronic device including the MEMS element 40.

Embodiment 2

Figure 2:
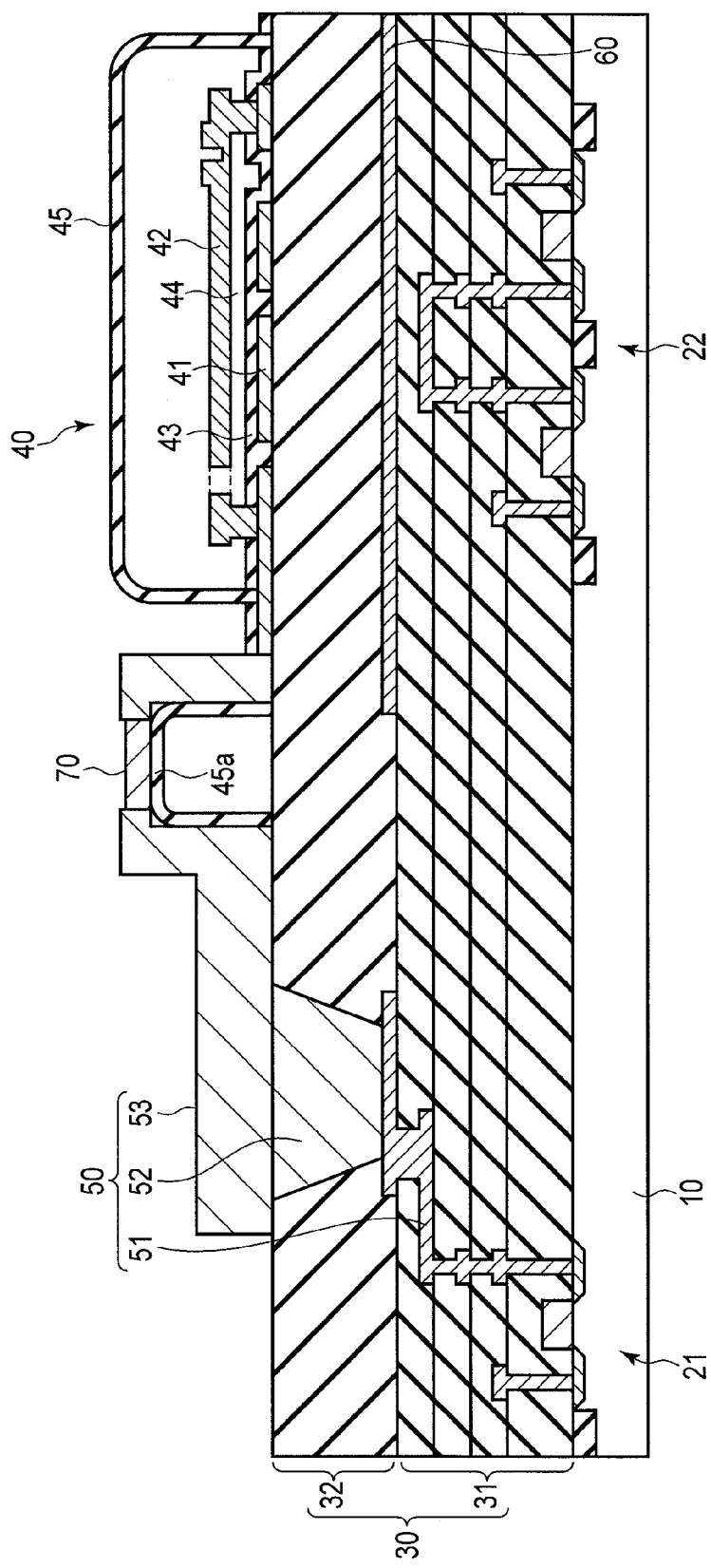
FIG. 2 is a cross-sectional view schematically showing the configuration of an electronic device according to a second embodiment.

FIG. 2 is a cross-sectional view schematically showing the configuration of an electronic device according to a second embodiment. It should be noted that the fundamental configuration is identical to the first embodiment described previously, and hence the constituent elements corresponding to the constituent elements shown in FIG. 1 are denoted by identical reference symbols, and detailed descriptions of them are omitted.

In the first embodiment described previously, although the resistive element 70 is directly provided on the upper insulating part 32, in this embodiment, a resistive element 70 is provided above an upper insulating part 32. More specifically, when a protective film 45 of a MEMS element 40 is formed, an additional protective film 45a is simultaneously formed in the middle of a conductive part 53 by the same method as the formation method of a protective film 45. Further, the resistive element 70 is formed on the additional protective film 45a.

In this embodiment too, the resistive element 70 is provided between a conductive part 52 and the MEMS element 40, and hence it is possible to obtain the same advantage as the first embodiment. Further, the resistive element 70 is provided on the additional protective film 45a, and hence it is possible to make a distance between the resistive element 70 and a substrate 10 larger, and further reduce the parasitic capacitance between the resistive element 70 and substrate 10.

Embodiment 3

Figure 3:
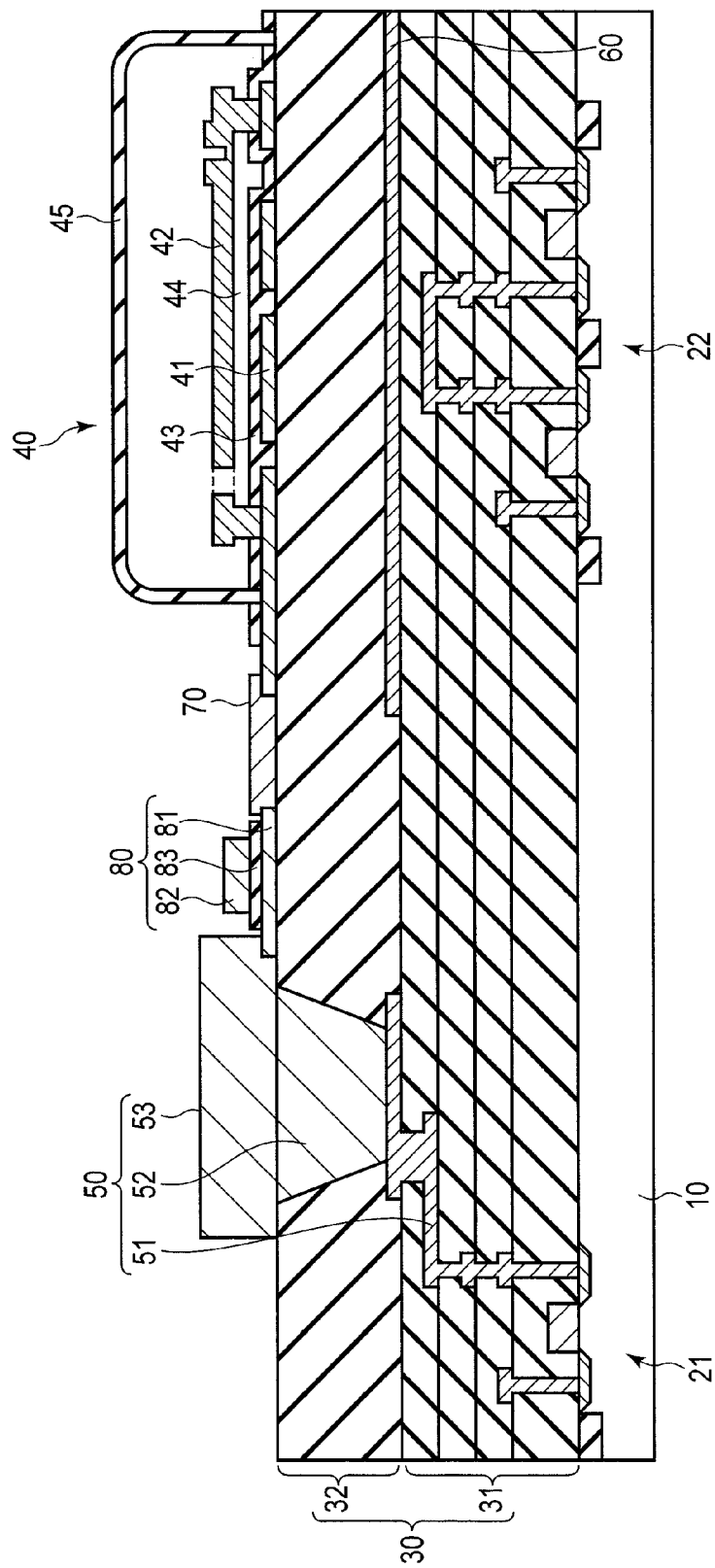
FIG. 3 is a cross-sectional view schematically showing the configuration of an electronic device according to a third embodiment.

FIG. 3 is a cross-sectional view schematically showing the configuration of an electronic device according to a third embodiment. It should be noted that the fundamental configuration is identical to the first embodiment described previously, and hence the constituent elements corresponding to the constituent elements shown in FIG. 1 are denoted by identical reference symbols, and detailed descriptions of them are omitted.

In this embodiment, a capacitor element 80 connected to a resistive element 70 is provided, and the resistive element 70 and the capacitor element 80 constitute a low-pass filter. More specifically, the capacitor element 80 of a metal-insulator-metal (MIM) structure including a lower electrode 81, upper electrode 82, and insulating film 83 is provided on an upper insulating part 32. The lower electrode 81 of the capacitor element 80 is connected to the resistive element 70, and functions as part of a conductive part 53, and the upper electrode 82 of the capacitor element 80 is connected to the ground (the RF ground or the ground of a drive circuit 21).

In this embodiment too, the resistive element 70 is provided between a conductive part 52 and MEMS element 40, and hence it is possible to obtain the same advantage as the first embodiment. Further, the resistive element 70 and the capacitor element 80 constitute the low-pass filter, whereby it is possible to prevent the high-frequency component from leaking from the MEMS element 40 into the drive circuit 21 more effectively.

It should be noted that in the first to third embodiments described above, although the variable capacitor element is used as the MEMS element 40, other high-frequency application elements may be used as the MEMS element 40. Further, it is also possible to use an element other than the MEMS element as the element 40.

Further, in the first to third embodiments described above, although a silicon film such as a polysilicon film, amorphous silicon film, and the like is used as the resistive element, a carbon nanotube film may be used as the resistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a semiconductor substrate;
   a drive circuit provided on the semiconductor substrate;
   an insulating region including a first insulating part provided on the semiconductor substrate and comprising a plurality of interlayer insulating films, and a second insulating part provided on the first insulating part, the insulating region being configured to cover the drive circuit;
   an element for high-frequency, which is provided on the insulating region and which is driven by the drive circuit, and to which a high-frequency signal is applied;
   an interconnection including a first conductive part provided in the first insulating part, and a second conductive part provided in the second insulating part, the interconnection being configured to transmit a drive signal from the drive circuit to the element for high-frequency; and
   a resistive element provided between the second conductive part and the element for high-frequency, the resistive element being provided on or above the second insulating part and being electrically connected to the second conductive part and the element for high-frequency.

2. The device of claim 1, wherein the resistive element prevents a high-frequency component from leaking from the element for high-frequency into the drive circuit.

3. The device of claim 1, wherein the resistive element comprises silicon.

4. The device of claim 1, wherein the resistive element comprises a carbon nanotube.

5. The device of claim 1, wherein the resistive element comprises a thin-film resistive element.

6. The device of claim 1, wherein the second insulating part comprises an insulating film which is thicker than each of the plurality of interlayer insulating films of the first insulating part.

7. The device of claim 1, wherein the second insulating part comprises one of a silicon dioxide film and a resin film.

8. The device of claim 1, wherein the element for high-frequency comprises a MEMS element.

9. The device of claim 1, wherein the element for high-frequency comprises a variable capacitor element.

10. The device of claim 1, further comprising a capacitor element for a low-pass filter, which is connected to the resistive element.

11. The device of claim 1, wherein the second conductive part is provided in a via hole formed in the second insulating part.

12. The device of claim 1, further comprising a shield provided at a position inside the insulating region and below the element for high-frequency.

13. The device of claim 1, wherein the drive circuit includes a CMOS circuit.

14. The device of claim 1, wherein the resistive element is provided at a position closer to the element for high-frequency than the second conductive part.

15. The device of claim 1, wherein the resistive element is electrically connected to the second conductive part and the element for high-frequency on a same face of the second insulating part.

16. An electronic device comprising:
    a semiconductor substrate;
    a drive circuit provided on the semiconductor substrate;
    an insulating region including a first insulating part provided on the semiconductor substrate and comprising a plurality of interlayer insulating films, and a second insulating part provided on the first insulating part, the insulating region being configured to cover the drive circuit;
    an element for high-frequency, which is provided on the insulating region and which is driven by said drive circuit, and to which a high-frequency signal is applied;
    an interconnection including a first conductive part provided in the first insulating part, and a second conductive part provided in the second insulating part, the interconnection being configured to transmit a drive signal from the drive circuit to the element for high-frequency; and
    a resistive element provided between the second conductive part and the element for high-frequency, at a position closer to said element for high-frequency than the second conductive part.

17. The device of claim 16, wherein the resistive element is provided on or above the second insulating part.

18. An electronic device comprising:
    a semiconductor substrate;
    a drive circuit provided on the semiconductor substrate;
    an insulating region including a first insulating part provided on the semiconductor substrate and comprising a plurality of interlayer insulating films, and a second insulating part provided on the first insulating part, the insulating region being configured to cover said drive circuit;
    an element for high-frequency, which is provided on the insulating region and which is driven by said drive circuit, and to which a high-frequency signal is applied;
    an interconnection including a first conductive part provided in the first insulating part, and a second conductive part provided in the second insulating part, the interconnection being configured to transmit a drive signal from the drive circuit to the element for high-frequency; and
    a resistive element provided between the second conductive part and the element for high-frequency, the resistive element being electrically connected to the second conductive part and the element for high-frequency.

19. The device of claim 18, wherein the resistive element is provided at a position closer to the element for high-frequency than the second conductive part.

* * * * *